Feb. 16, 1965 J. H. LEMELSON 3,169,892

METHOD OF MAKING A MULTI-LAYER ELECTRICAL CIRCUIT

Filed Dec. 27, 1960

INVENTOR.
Jerome H. Lemelson
BY
Ostrolenk, Faber, Gerb & Soffen
ATTORNEYS

United States Patent Office 3,169,892
Patented Feb. 16, 1965

3,169,892
METHOD OF MAKING A MULTI-LAYER ELECTRICAL CIRCUIT

Jerome H. Lemelson, 85 Rector St., Metuchen, N.J.

Filed Dec. 27, 1960, Ser. No. 86,838
11 Claims. (Cl. 148—6.3)

This invention relates to a method of fabricating electrical components and circuit elements. This is a continuation in part of my copending application Serial Number 805,025, filed on April 8, 1959, and now abandoned. This is also a continuation-in-part of my copending application Serial Number 24,393 for Electrical Game Apparatus, filed on April 25, 1960, and now abandoned.

It is known in the art to produce an electrical circuit or circuit element by chemically removing or etching areas of a sheet of metal bonded to a base. The general term "printed circuit" has been applied not only to circuits which are printed or silkscreened on a base or circuit board but also to circuits which are formed by etching. Metal sheet or foil in the order of several thousandths of an inch in thickness or greater is generally employed for the conducting components of such circuits and such material is not easily applied in the fabrication of so called microminiature circuits due to a number of shortcomings. One drawback for such metal sheeting is its comparative thickness. Another resides in the means heretofore provided for insulating exposed surfaces and applying subsequent circuits thereover. Dielectric plastic materials have been coated over exposed circuit elements but these generally are not easy to apply and circuit elements are not easily applied thereover without further preparation and treatment of said plastic. In order to be cured, such plastic requires heating and the retention of temperatures for prolonged periods of time.

It is accordingly a primary object of this invention to provide a new and improved structure in an electrical circuit and an improved method of making the same.

Another object of this invention is to provide an improved electrical element and an insulation therefor.

Another object is to provide improved means for fabricating multi-layer electrical circuits having a high density of conducting elements and applicable to the manufacture of microminiature components and circuits.

Another object is to provide an improved method of electrically insulating a circuit member with an oxide film or coating formed directly on the circuit member.

Another object is the provision of improved multiple layer circuits and improved methods for forming said circuits by vacuum deposition of both the conducting portions of said circuits and the insulating interlayers thereby eliminating the need for chemical etching of circuit members.

Still another object is the provision of a new method of making multiple layer circuits over an extended area of a circuit board with each layer being of substantially constant thickness and containing conducting as well as non-conducting portions, thereby simplifying fabrication and permitting the stacking of multiple layers containing circuits between insulating layers without circuit elements extending out of a particular layer so that any number of circuit layers may be built up without difficulty, while retaining a flat upper surface.

Another object is to provide an improved method of fabricating an electrical conductor containing a resistance portion. Another object is to provide a method of fabricating an electrical conductor pair in a capacitance circuit.

Another object is the provision of a new type of electrical resistor and a new capacitator both of which are applicable to microminiaturized circuitry.

Another object is to provide an improved method of forming a dielectric film on an article of manufacture by sequentially or simultaneously vacuum depositing a metal and converting the deposited metal in the same chamber to a dielectric material.

Another object is to provide an improved method of insulating articles of manufacture.

Yet another object is to provide an improved method of vacuum coating articles of manufacture.

Still another object is to provide improved means for constructing circuits and securing elements thereto.

Another object it to provide an improved means for making a circuit from a single layer of conducting material without the need for etching or mechanically removing portion of said conducting material.

Another object it to provide means for fabricating circuits and circuit components of a high degree of precision without the possibility of contaminating portions thereof.

With the above and other such objects in view, as may hereinafter more fully appear, the invention consists of the novel construction, combination and arrangement of parts as well as methods of fabrication which will be hereinafter more fully described and illustrated in the accompanying drawings, wherein are shown embodiments of the invention but it is to be understood that changes, variations and modifications may be resorted to which fall within the scope of the invention as claimed.

In the drawings, which form part of the description:

Figures 1, 2, 3, 4, 5, 6, 7, 8, 9, 10:
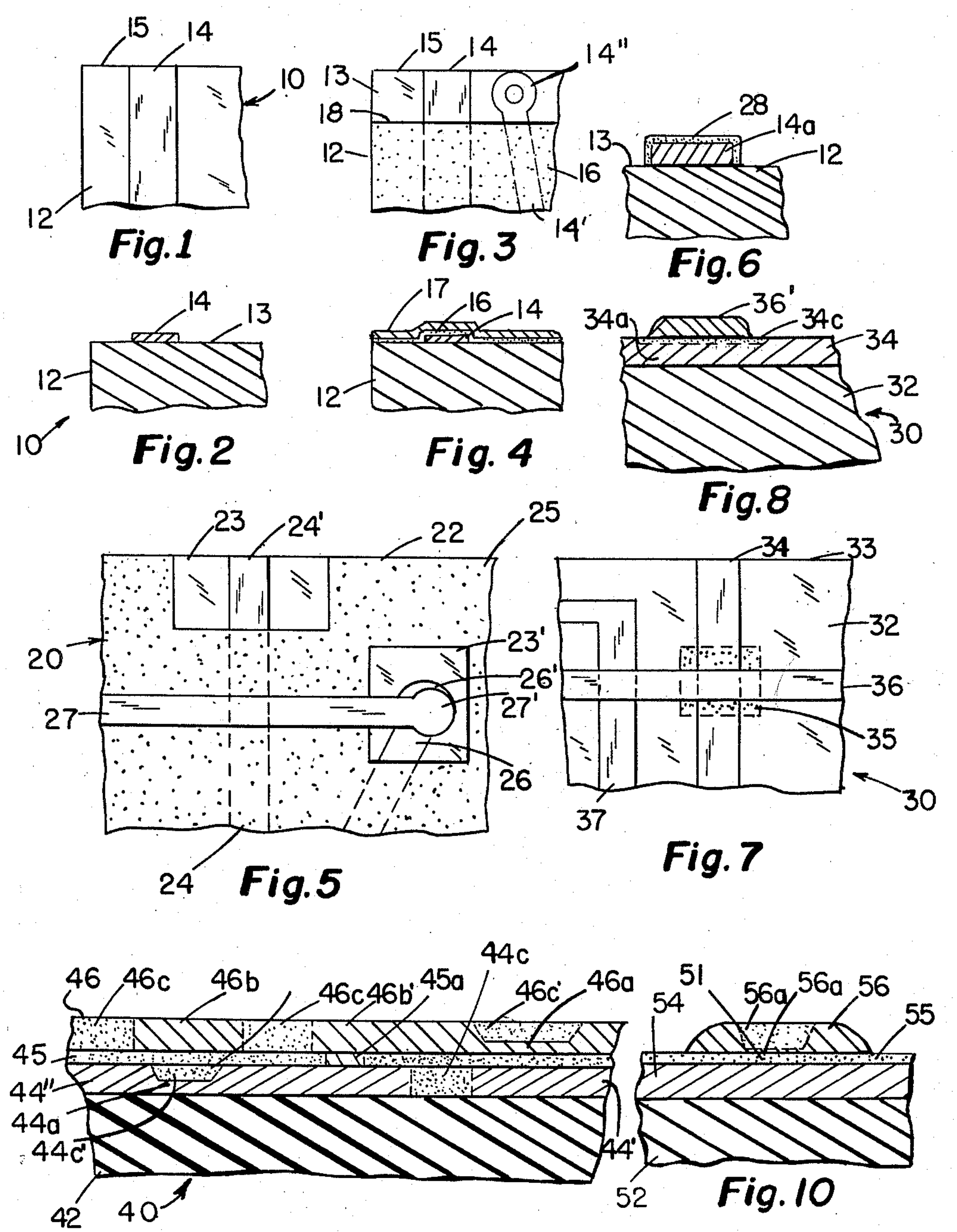
FIG. 1 is a fragmentary view taken from above a circuit member prior to further fabrication thereof and FIG. 2 is an end cross sectional view of the fragment of FIG. 1.
FIG. 3 shows the circuit member of FIG. 1 further processed with an insulating layer which has been formed from a layer of metal.
FIG. 4 is a cross-section of FIG. 3.
FIG. 5 is a plan view of a circuit board showing further details of structure applicable to multi-layer circuits.
FIG. 6 is a cross-section of part of a circuit element on a base which element has been insulated in accordance with the teachings of the invention.
FIG. 7 shows a further circuit structure in plan view.
FIG. 8 is a cross-sectional view of still another structure in a circuit element and an insulating portion thereof.
FIG. 9 is an end cross-section of a circuit board showing multiple layers of conductors and dielectrically separated from each other with means for interconnecting alternate layers and for producing circuits thereof.
Figure 9:
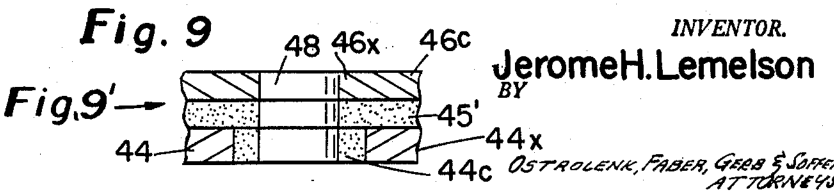

FIG. 9' shows a further circuit structure in cross-section applicable to the other structures illustrated; and FIG. 10 shows a structure in a conductor in cross-section which conductor has been partly converted to a dielectric material.

FIGS. 1 and 2 illustrate a portion of an electrical circuit member such as a circuit board or other components consisting of an assembly 10 of a base 12 which is preferably made of insulating material and which has an electrical circuit member 14 bonded or otherwise secured to its upper surface 13 and illustrated as shaped in a thin strip, layer or film of electrically conducting metal. It is assumed that the circuit conductor 14 terminates at or near an edge 15 of the base or board 12 at which end it may be electrically connected to another circuit or an electrical device. The element 14 may have any suitable thickness varying from that of a thin film in the order of microns in thickness or less to that of a strip of metal applied directly to surface 13 per se or formed thereon after etching a larger sheet or coating of metal bonded to 13. In other words, the conducting circuit element 14 may be applied as a sheet of metal to 12, electrodeposited on the upper surface 13 of 12 by various known techniques, or metallized or vacuum coated on 13 either in the shape illustrated or as a uniformly distributed layer which is thereafter shaped by a mechanism or chemical action.

In FIGS. 3 and 4 a coating or film 16 of metal has been applied by vacuum depositing from the vapor state or electro-deposition of said metal completely over substantially all of the exposed surface of said film or strip 14 and preferably over most of the adjacent surface 13 of 12. The entire layer or film 16 is thereafter completely converted to a non-conducting or dielectric material so that it forms an insulating coating for the conductor 14. The notation 18 refers to a line defining the edge of a mask which is placed adjacent the edge 15 of the circuit board 12 either prior to the application of the conducting layer 16 thereto or prior to the application of the material or atmosphere which converts 16 to a dielectric material so that the end portion 14' of 14 is either exposed or consists entirely of an electrically conducting material and may therefore be electrically connected to another component or circuit by soldering, welding or fastening means.

The base 12 may consist of any suitable rigid or flexible insulating material such as thermo-setting plastic, glass, plastic-glass laminates or the like. It may also comprise a sheet of metal the upper surface of which is coated with or converted to an insulating layer on which 14 is deposited or secured. The conductor 14 may consist of any suitable conducting metal. The metal applied as layer 16 may also consist of any suitable metal which may be entirely converted thereafter to a non-conducting compound of said metal. For example, 16 may at first comprise a coating or film of aluminum which is vacuum or electro-deposited on 14 and 12. It may thereafter completely be oxidized by exposure to a suitable atmosphere to form a dielectric coating. If the layer comprising 16 is thin enough it will convert to aluminum oxide in air at room temperature. The process may be hastened for heavier layers of aluminum such as sheet by applying oxidizing gases or vapors thereto. For example, if the coating or film 16 is heated in the range 300 to 600 degrees centigrade and is exposed to an atmosphere of hydrogen fluoride or is exposed to elemental fluorine, the resulting reaction if sustained long enough may be used to convert the entire layer 16 to the metal fluoride compound. A coating of said fluoride in the order of 1 to 2 microns in thickness will exhibit a resistance value in the order of $10^{10}$ or more ohms. Depending on the thickness of layer 16 it may be necessary to sustain the reaction for a period of time in which a small portion of the outer layer of conducting element 14 is also reacted on by said oxidizing atmosphere or material and is converted to a dielectric compound to guarantee complete conversion of all the metal of layer 16. The notation 14' in FIG. 3 refers to a second conducting strip on 12, the end of which is shaped with an eye 14'' which is exposed for connection thereto.

In FIG. 5 is illustrated a portion of an electrical device 20 which is fabricated in accordance with the teachings and the technique of FIGS. 1 to 4 and in which a further conducting element is applied to the base. The insulating base 22 may be any suitable shape and is illustrated as a flat sheet or plate. Applied first thereto as described, is a thin strip of conducting material referred to by the notation 24. Applied over that surface of 22 against which 24 is applied, is a coating or film of metal 25 which is entirely converted to a dielectric coating or film as described. The notation 23 refers to a portion of the surface of 22 containing thereon element 24 which does not contain the dielectric covering 25 and is thereby accessible for connection to another circuit device or element. A second circuit element which may also be an extension of 24, extends beneath the dielectric covering 25 against the upper surface of base 22. A second area 23' of the surface of 22 on which the end 26' of 26 extends, is also void of the material of the insulating layer 25. Extending across the upper surface of 25 is a third circuit element 27 which may be applied as a thin strip, coating or film of metal thereto. The strip 27 crosses strip 24 and is insulated therefrom by the layer 25 of dielectric material. The end 27' of 27 is shown as extending across the area 23' and is in surface contact with the end 26' of 26. The element 27 may be applied to 25, 23' and 26' by any of the techniques described for the application of 14 to 12 including vacuum deposition, electro-deposition or plating, spraying, or adhesively bonding to 25 with the end 27' thereof welded or soldered to 26'. The structures illustrated in FIG. 5 are applicable to the fabrication of various improved circuit elements and circuits in which a high density of components per unit volume is desired. It can easily be seen that if the circuit elements 24, 26, 27, etc., are applied as thin layers or films and the insulating layer or layers 25 are applied therebetween as thin layers or films, a substantial number of circuits may be constructed as a multiple layer unit with each circuit element or group of elements in one layer separated from those of the next layer as well as from each other by respective layers of deposited metal which has been completely converted to an oxide or other dielectric compound as described.

In another form of the invention it is noted that in constructing a multi-layer circuit element of the types illustrated in FIGS. 1 to 5, one or more of the metal coatings such as 25 may be only partly converted to the oxide or dielectric compound of said metal with remaining portions serving as further circuit elements. Said partial conversion of the dielectric material may be effected by masking those areas of the film or coating to prevent their exposure to the oxidizing atmosphere or chemical, which masking may be a removable stencil or mask or may be a coating of a dielectric material applied permanently thereto or stripped therefrom thereafter. The area or circuit structure where element 27 crosses over, but is insulatedly supported above element 24, may define an electrical circuit device such as a capacitor. Element 27 is shown extended or widened in area where it crosses over element 24 at *27a*.

Various modifications in the structures illustrated in FIG. 5 are possible and may include the provision of additional layers of dielectric material and circuit conducting elements over those shown, the securing of separate circuit components to exposed areas of the circuit components such as the end 24' of 24 and 26', which components may be integrally bonded to the base and may also be coated with a dielectric material as described or masked to prevent said coating. Various electrical components such as capacitors, diodes, semi-conductors, resistors and the like may also be applied to 20 and electrically connected to one or more exposed portions of circuit elements deposited or otherwise secured thereto by means of vacuum or electro-deposition, spraying or other known techniques for the construction of more elaborate circuits. A mask or masking means may be applied to define the areas of these materials which are deposited on the exposed surface of the base 20, conducting element 27 or dielectric layer 25. In other words the circuit elements may be formed by selective deposition on the base material, the dielectric layer may be formed by the selective deposition of a metal and/or the selective conversion of all or parts of said metal to an oxide or dielectric compound thereof and the subsequent circuit elements may also be formed by the selective deposition of a metal on the resulting upper surface.

FIG. 6 illustrates a modified form of the embodiment presented in FIGS. 1 to 4 in which only the exposed surface of the circuit element *14a* which is bonded to the upper surface 13 of base 12 is coated with an oxide or dielectric layer 28. The layer 28 may be formed by exposing the element *14a* to an oxidizing atmosphere or liquid and converting part of it to the oxide of said metal forming layer 28. The outer surface of *14a* may also be coated with a film or layer of a metal such as that comprising 16 which may thereafter be converted to its dielectric compound as described. The exposed surface of strip 14a itself may also be converted to the dielectric compound of the metal of which said strip is made by treatment with an oxidizing chemical. In other words, the layer 28 of oxidizing material may have been made by conversion of the surface layer of said element.

In FIG. 7 is shown a further structure in an electric circuit member or circuit board made in accordance with the teachings of the invention. The assembly 30 comprises a base member such as an insulated sheet or board having a first circuit element 34 in the form of a strip, coating or film deposited or adhesively bonded thereto. A second conductor 36 in the form of a thin flat strip or film of metal extends lateral to 34 and crosses thereover. The notation 35 refers to an insulating layer of limited area disposed between 34 and 36 in the area of cross-over. The patch 35 may be formed by vacuum or electro-depositing a metal through a mask or stencil after the formation or securing of 34 to 32, directly over that length of 34 across which 36 will pass. Thereafter the patch of metal film or coating 35 is converted, at least in part, to the oxide or dielectric compound of the metal over which strip 36 is deposited or adhesively secured. The notation 37 refers to another conducting strip of metal which has been deposited with strip 34 and is shown electrically connected to 36 which is deposited directly thereon.

FIG. 8 shows a cross-over structure for two circuit elements on the surface of a base 32. The circuit element 34 adjacent 32 is provided of sufficient thickness to permit part of the upper portion or surface layer 34c thereof to be converted to a dielectric oxide layer for a length sufficient for a second circuit element 36′ to be deposited or otherwise secured to the upper surface of said strip and to be insulated from the conducting portion thereof. The notation 34a refers to the remaining, lower portion of that segment of 34 which is still conducting. If it is desired to retain the cross section of the portion 34a of 34 equal to that of the cross section of the rest of the strip so that the resistance thereof will not be greater than that of the rest of the strip, the strip may be provided of increased width along the length thereof defined by portion 34a.

FIG. 9 illustrates additional structures in printed circuit boards and the like provided in accordance with the teachings of this invention. The circuit board or assembly 40 consists of an insulated base 42 on which a first circuit element or elements 44 is deposited or otherwise provided as described. The notation 44c refers to a section of 44 which has been completely converted to an oxide or other compound rendering it a dielectric which divides 44 into two segments, 44′ and 44″. The conversion of 44c to said oxide of said metal may be effected by masking the remaining surface of 44 and applying an oxidizing atmosphere to the outer surface of 44c for a sufficient time to permit complete conversion of said metal. If 44 is applied as a film or layer coating all or a substantial portion of the upper surface 43 of 42, a circuit in the form of element 44 and others may thus be formed thereof by converting the areas between what will eventually be the conducting elements to the dielectric compound of the metal layer or film from which 44 is formed.

To one side of 44c, a portion af 44″ has been partly converted to dielectric material by masking the remainder of the element and exposing the surface of a segment 44c′ to a dielectric forming chemical or atmosphere for sufficient time to convert a predetermined thickness thereof to a non-conductor or semi-conductor. The remaining portion 44b of 44″ is of substantially less thickness than the rest of 44″ and if the strip is of substantially constant thickness, portion 44b will have a higher resistance and may be used as a resistor in the circuit defined in part by 44″.

Deposited over 44 is a layer or film of metal which has been converted as described to a dielectric material with the exception of areas such as 45a thereof which have been masked from the oxidizing atmosphere and may be electrically connected to either or both the lower conductor and an upper conductor 46 which has been deposited or otherwise applied thereover. In other words, the dielectric layer 45 may also be used as part of the circuit.

If all layers of a circuit member such as 40 are deposited by vacuum or electro-deposition and circuits are formed thereof as provided in FIG. 9 by conversion of certain areas of each layer to a dielectric material as described without substantially reducing or increasing the thickness of each layer, then, it is noted that each circuit element or conductor will remain in its particular layer and will not extend out of said layer in order to conform to a changing upper surface of the type which results from the selective deposition of conducting circuit elements and components. The significance of such fabrication method is that any number of circuit layers may be stacked one on the other without eventually resulting in a formation with a highly irregular surface on which it is difficult to add or deposit circuit components due to the contour thereof. By the structure and method of FIG. 9 the circuits and components of one layer may be electrically connected to those of the next layer above or below which it is insulated from by the intermediate layer of dielectric material (45) by not converting a portion of said intermediate layer which is in alignment with the circuit elements to be connected. For example, the portion 45a of intermediate layer 45 is retained as a metal by masking it so that it is not converted to the oxide when the upper or outer surface thereof is exposed to said oxidizing atmosphere. Conducting portion 45a therefore electrically connects strip portion 46b′ with portion 44″ in the lower conducting layer 44. If it is desired to deposit or secure other circuit elements or conducting or semi-conducting materials for connection to circuit elements in any particular layer, a mask may be used for the etching of selected areas of the layer or layers therebeneath so that material may be deposited in the resulting cavity or secured therein and may be retained below the surface of the layer. By completely filling the cavity with material, an uninterrupted surface may be presented for the next layer to be deposited on.

Illustrated in FIG. 9′ is a further circuit construction which may be applied to a circuit member such as 40. Shown are three deposited layers of conducting and non-conducting material. The lower layer 44x may be part of a further circuit stack or may be directly secured to a base such as 42 of FIG. 9. An intermediate dielectric layer 45′ covers the conducting strip 44 and the non-conducting portion of its layer. A third layer 46x of conducting and non-conducting material is deposited on layer 45′ and formed into a circuit as described. The notation 48 refers to a cavity or hole provided through two or more of the layers which cavity may be provided by mechanical or electrical drilling, milling or etching. The hole passes through a conductor 46c in the upper layer 46x, through the insulating layer 45′ and through an insulating portion 44c of the lowest illustrated layer 44. A semi-conducting material may be filled or deposited by any known means in the multi-layer hole or cavity thus provided which material may form a component of substantial thickness as compared to the thickness of one of the layers. The resulting component may be electrically connected to one or more circuit elements of the upper layer by contact therewith and may completely fill the cavity or be surrounded with a potting compound to fill out the remainder of said cavity so as to provide an upper surface which is flat. Contact of the lower end of the component with a conductor in a lower strata or layer may be used to effect electrical connection therewith, whereupon that portion of the cavity or hole would be made through a conducting portion of the layer. Partly filling the hole with a conducting material such as a liquid metal or a deposited metal will assure electrical connection of the lower portion of the component with the conductor of the lower level. Electrodeposition may be employed to provide said connecting material in the hole for connecting the component placed or deposited in the hole with the conductor of the lower layer by exposing the cavity with the component therein and partly filling said cavity to the flow of vacuum of electro-deposited material.

Subsequently deposited layers of conducting material such as layer or strip 46 applied above the dielectric layer 45 may be etched or partly converted to dielectric material for the formation of circuits and circuit components such as the described resistor portions. Capacitance circuits may also be provided where two or more layers or strips of conducting material cross each other and are separated by a thin dielectric layer of the type described. A unique capacitive-resistance circuit construction is illustrated in FIG. 10. The assembly comprises at least in part, a first conducting layer or strip 54 deposited or otherwise secured to a circuit board or base 52, over at least part of which is provided a thin dielectric layer 55. A second strip of metal 56 extends oblique or normal to 54 across 55. A portion 56*c* of 56 has been converted to dielectric material by masking and exposure, as described, to an oxidizing atmosphere for a predetermined time period, leaving a portion 56*a* of 56 in the area of cross-over. The junction 51 or cross-over area thus provides a resistance in the circuit comprising element 56 and a capacitance between 56 and 54.

Whereas the dielectric portion 56*c* is shown in FIG. 10 as extending only partly across the width of the strip 56, the entire width of strip 56 may be converted to the dielectric oxide compound in the manner that strip 46*a* of FIG. 9 is converted by exposure of the entire width thereof to said oxidizing atmosphere. The remaining conducting portion 56*a* may have any desired thickness from that in the order of microns or less to several thousandths of an inch depending on the characteristics desired of the resistor and the conducting layer portion. In other words, the structure of FIG. 10 may be used to provide film resistors which are an integral part of a conductor of substantially greater thickness.

As heretofore stated, dielectric coatings may be provided of coatings or films of metal deposited by vacuum deposition means on circuit members by oxidizing the film by exposure to an oxidizing atmosphere. Thin films of aluminum may be converted to aluminum oxide, a dielectric, by exposure to oxygen such as that present in air. To hasten the process, the part and/or the atmosphere may be heated. Fluoride coatings of the metal such as that obtained when aluminum is exposed to hydrogen fluoride, may also be provided and result in an effective dielectric coating for the conductor(s) of the circuit devices.

The following procedure for providing a dielectric coating on an article of manufacture is noted which will reduce the time required for processing the article and provide a coating of superior quality. The article is first heated either prior to or after its admission to a vacuum chamber, to a predetermined temperature. The article is mounted or otherwise made an electrode of the vacuum metallizing system or positioned whereby it will receive the vapor of the metal which is thereafter vapor deposited thereon. Portions of the surface of the article may be masked to prevent deposition on the surfaces thereof. Either during the vacuum deposition process while the metal is being deposited on the article or immediately thereafter, a predetermined quantity of the oxidizing atmosphere, such as hydrogen fluoride, is introduced into the chamber preferably adjacent the surface which is coated or is being coated. As a result, reaction takes place immediately while the article is at elevated temperature in the vacuum chamber. Noted advantages of this process include (*a*) an improved bond of the vaporized metal to the article is effected due to the heating of the vaporized layer and the resulting effect on the physical state thereof. A molecular bond or welding of the vacuum deposited layer of metal is effected if the surface temperature of the article is in the range of 600° C. for aluminum. (*b*) The conversion to the oxide or fluoride dielectric compound of the metal occurs more rapidly since the coating metal is at elevated temperature. (*c*) The need for reheating and rehandling the article is eliminated and cycle time is reduced. The article to be coated, may be heated while in the vacuum chamber after the normal atmosphere or air has been removed therefrom, by induction heating means or other means thereby reducing or eliminating surface oxidation resulting from exposure to the air at temperature and providing a vacuum coating of known composition on a surface of known composition. In other words, the quality of the coating as well as that of the surface on which it is deposited is known and may be retained without the introduction of impurities. By heating the article in the vacuum chamber or in a chamber having a known atmosphere of vaporizing metal and/or oxidizing composition or atmosphere. By employing apparatus which introduces the vaporized metal and an oxidizing vapor or gas such as hydrogen fluoride simultaneously against the surface of the base or circuit board said metal may actually reach the surface of the board in a partially or completely converted or oxidized state.

I claim:

1. A method of fabricating a multi-layer electrical circuit having a high density of individual circuit elements which comprises the steps of: sequentially applying first, second and third layers of conductive metals to an insulated base, selectively converting predetermined portions of each of said layers of conductive metal to a dielectric compound thereof, thereby providing a plurality of individual circuit elements, the converted portions electrically insulating adjacent conductive elements from one another, conductive portions of said second intermediate layer electrically interconnecting juxtaposed conductive portions of said first and third layers, and converted portions of said second intermediate layer electrically insulating juxtaposed conductive portions of said first and third layers.

2. A method of fabricating a multi-layer electrical circuit in accordance with claim 1, wherein said selective converting includes masking those portions of the conductive metal layers not to be converted, and subjecting the exposed portions of said metal layers which are not masked to an oxidizing atmosphere to convert a predetermined depth of said exposed portions to a dielectric compound.

3. A method of fabricating a multi-layer electrical circuit in accordance with claim 2, wherein the subjecting to the oxidizing atmosphere is for varying time intervals about said exposed portions to selectively vary the depth of conductive metal converted to the dielectric compound thereof.

4. The method of fabricating a multi-layer electrical circuit having a high density of individual circuit elements of claim 1, wherein said selective converting includes masking those portions of the conductive metal layer not to be converted, heating the exposed portions of said conductive metal layer to a temperature above about 300° C., and subjecting it to a fluoride containing atmosphere to convert a predetermined depth of said unmasked portion to a dielectric fluoride compound.

5. A method of fabricating a multi-layer electrical circuit having a high density of individual circuit elements, which comprises:

(*a*) vapor depositing a first thin layer of a conductive metal having a uniform depth on an insulated base;

(b) selectively converting predetermined portions of said first thin layer to a dielectric compound thereof to provide a plurality of individual circuit elements therein separated by said dielectric portions;

(c) vapor depositing a second thin layer of a conductive material having a uniform depth on said first thin layer;

(d) selectively converting predetermined portions of said second thin layer to a dielectric compound thereof, thereby providing an insulating layer covering a first selective conductive portion of said first thin layer, the non-converted regions of said second thin layer providing electrical access to second conductive portions of said first thin layer;

(e) vapor depositing a third thin layer of a conductive material having a uniform depth on said second thin layer;

(f) selectively converting predetermined portions of said third thin layer to a dielectric compound thereof to provide a plurality of individual circuit elements separated from each other by said dielectric portion thereof, and from the first conductive portions of said first thin layer by the dielectric portion of said second thin layer;

(g) said non-converted region of said second thin layer electrically interconnecting said second conductive portion of said first thin layer to a conductive portion of said third thin layer.

6. A method of fabricating a multi-layer electrical circuit having a high density of individual circuit elements as set forth in claim 5, wherein the selective conversion of at least one of said layers is predeterminedly varied about the surface thereof to selectively vary the depth of the conductive metal converted to a dielectric compound thereof.

7. A method of fabricating a multi-layer electrical circuit having a high density of individual circuit elements, as set forth in claim 5, including the further steps of: providing a cavity through aligned portions of said first, second and third layers and depositing a circuit component in said cavity; and electrically connecting said circuit component to the conductive region of at least one of said layers.

8. A method of fabricating an electrical circuit having a high density of individual circuit elements comprising the steps of:

applying a first thin layer of a conductive metal to an insulated base;

masking selected portions of said first layer of conductive metal;

subjecting the remaining portions of said first layer of conductive metal to an oxidizing atmosphere to convert the entire depth thereof to a dielectric compound;

said selected portions defining electrically conductive regions of individual circuit elements and conductive paths;

the converted portions electrically insulating adjacent ones of said selected portions from each other;

applying a second thin layer of a conductive metal over preselected portions of said first thin layer, such that portions thereof overlie at least part of said dielectric compound;

subjecting at least a portion of said second layer of conductive metal to an oxidizing atmosphere to convert the entire depth thereof to a dielectric compound;

said converted portion of said second layer overlying at least a portion of the electrically conductive regions of said first layer, for electrical insulation thereof;

and electrically connecting at least one of said circuit elements into a desired circuit.

9. A method of fabricating an electrical circuit comprising the steps of:

vacuum depositing a thin film of a conductive metal on an insulated base;

masking strip-like portions of said deposited film;

subjecting the remaining portions of said deposited film to an oxidizing atmosphere to convert the entire depth thereof to a dielectric compound; said strip-like portions defining individual circuit conductors;

the converted portions electrically insulating selected ones of said individual circuit conductors from each other;

depositing at least one circuit component between and across electrically insulated ones of said individual circuit conductors;

electrically connecting said circuit component to at least one of said individual circuit conduits to define an electrical circuit therewith.

10. A method of fabricating an electrical circuit board, including at least one electrical resistor, comprising the steps of:

applying a thin layer of a conductive metal to an insulated base;

masking space-separated portions of said layer of conductive metal;

subjecting the intermediate exposed portion of said layer of conductive metal to an oxidizing atmosphere to convert a predetermined partial depth thereof to a dielectric compound, the non-converted depth of said partially converted portion having an electrical resistance greater than the per unit area electrical resistance of said thin layer of conductive metal to define an electrical resistor of predetermined magnitude;

said space separated portions defining electrical terminals for said intermediate portion.

11. The method of fabricating an electrical circuit element comprising the steps of:

applying a thin layer of conductive metal to an insulated base, masking space-separated portions of said layer of conductive metal, subjecting the intermediate exposed portion of said layer of conductive metal to an oxidizing atmosphere to convert a predetermined partial depth thereof to a dielectric compound, the non-converted depth of said partially converted portion having electrical conductivity characteristics varying significantly from the per unit area electrical conductivity characteristics of said thin layer of conductive metal, to define an electrical circuit element of predetermined conductivity characteristics, said space separated portions of said circuit element defining regions of less resistivity to current flow than said intermediate portion.

References Cited in the file of this patent

UNITED STATES PATENTS

| | | |
|---|---|---|
| 2,092,033 | Stroup | Sept. 7, 1937 |
| 2,501,563 | Colbert et al. | Mar. 21, 1950 |
| 2,548,514 | Bramley | Apr. 10, 1951 |
| 2,675,740 | Barkley | Apr. 20, 1954 |
| 2,748,234 | Clarke et al. | May 29, 1956 |
| 2,761,945 | Colbert et al. | Sept. 4, 1956 |
| 2,809,134 | McIlvaine | Oct. 8, 1957 |
| 2,886,475 | McKay | May 12, 1959 |
| 2,933,710 | Novak et al. | Apr. 19, 1960 |
| 2,934,736 | Davis | Apr. 26, 1960 |
| 2,937,410 | Davies et al. | May 24, 1960 |
| 2,944,586 | Yanulis | July 12, 1960 |
| 2,945,180 | Parker | July 12, 1960 |
| 2,993,819 | Nessim | July 25, 1961 |
| 3,053,698 | Ogle et al. | Sept. 11, 1962 |
| 3,055,775 | Crittenden et al. | Sept. 25, 1962 |